(12) United States Patent
Suh

(10) Patent No.: US 8,049,409 B2
(45) Date of Patent: Nov. 1, 2011

(54) ORGANIC LIGHT EMITTING DISPLAY

(75) Inventor: Misook Suh, Youngin-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 852 days.

(21) Appl. No.: 12/151,075

(22) Filed: May 2, 2008

(65) Prior Publication Data

US 2009/0033598 A1    Feb. 5, 2009

(30) Foreign Application Priority Data

Aug. 3, 2007 (KR) .................. 10-2007-0078157

(51) Int. Cl.
*H01J 1/62* (2006.01)
(52) U.S. Cl. ........................ 313/504; 313/506
(58) Field of Classification Search ........... 313/504–509
See application file for complete search history.

(56) References Cited

U.S. PATENT DOCUMENTS

2010/0171416 A1 * 7/2010 Lee ................................ 313/504

FOREIGN PATENT DOCUMENTS

| CN | 1638554 | 7/2005 |
|---|---|---|
| KR | 1020050070199 A | 7/2005 |
| KR | 1020050086319 A | 8/2005 |
| KR | 1020050121882 A | 12/2005 |

OTHER PUBLICATIONS

Chinese Examination Report dated Dec. 4, 2009, issued by the SIPO in Korean priority Application No. 10-2007-0078157.

* cited by examiner

*Primary Examiner* — Vip Patel
(74) *Attorney, Agent, or Firm* — Knobbe Martens Olson & Bear LLP

(57) ABSTRACT

Disclosed is an OLED in which separation regions of spacers in odd and even rows are formed so that a fine metal mask (FMM) between light emission layers may move without being caught in the spacers. The OLED includes even and odd spacers protruding upwardly between light emission layers and are separated by separation regions. The separation regions of each row of spacers is aligned with spacers of adjacent rows and are not aligned with the separation regions of the adjacent rows.

20 Claims, 5 Drawing Sheets

ORGANIC LIGHT EMITTING DISPLAY

CROSS-REFERENCE TO RELATED APPLICATIONS

This application claims priority to and the benefit of Korean Patent Application No. 10-2007-0078157, filed on Aug. 3, 2007 and, the entire content of which are incorporated herein by reference.

BACKGROUND

1. Field of the Invention

The field relates to an organic light emitting display (OLED), and more particularly, to an OLED in which the separation regions of odd spacers are different from the separation regions of even spacers so that a mask can move without being caught in the spacers and that endurance against an external shock increases to effectively protect a display region.

2. Description of the Related Technology

An organic light emitting display (OLED) is a display device that electrically excites florescent or phosphorous organic compounds to emit light. The OLED drives N×M organic light emitting diodes display to an image. In some embodiments, the organic light emitting diode includes an anode (ITO), an organic thin layer, and a cathode (metal). The organic thin layer generally has a multi-layer structure including an emission layer (EML), an electron transport layer (ETL), and a hole transporting layer (HTL) in order to improve a balance between electrons and holes and to thus improve emission efficiency, and may additionally include an electron injection layer (EIL) and a hole injection layer (HIL).

In the OLED, in order to display full colors, red (R), green (G), and blue (B) light emission layers may be patterned, respectively. In order to pattern the light emission layers, a shadow mask may, for example, be used in the case of a small molecular OLED and an ink-jet printing or laser induced thermal imaging (LITI) method may be used in the case of a polymer OLED. The organic layers can be finely patterned by the LITI method. The LITI method can be used for a large area and is advantageous for high resolution. The ink-jet printing method is a wet etching process, the LITI method is a dry process. However, in the LITI method, the light emission layers are patterned using a fine metal mask (FMM). The slits of the FMM are caught in the regions where spacers are separated from each other during processes. When the spacers are integrated without being separated from each other, a cathode electrode on the spacers is sometimes shorted due to a step difference between the spacers so that the OLED may be defective.

SUMMARY OF CERTAIN INVENTIVE ASPECTS

One aspect is an organic light emitting display including a plurality of arrayed light emission layers, the layers arranged in a plurality of rows and columns, where adjacent rows are separated by a plurality of even and odd gaps, the even and odd gaps being interleaved, a pixel define layer formed in the periphery of each of the light emission layers, a plurality of odd spacers, each protruding from one of the pixel define layers, the odd spacers formed in odd gaps and having a plurality of odd separation regions, and a plurality of even spacers, each protruding from one of the pixel define layers, the even spacers formed in even gaps and having a plurality of even separation regions, where the odd separation regions are formed in different columns than the even separation regions.

Another aspect is an organic light emitting display including a plurality of emission layers, and a plurality of rows of spacers between the emission layers, the spacers in each row being separated by a plurality of separation regions, where the separation regions of each row are aligned in a direction perpendicular to the rows with spacers of adjacent rows.

BRIEF DESCRIPTION OF THE DRAWINGS

The above and other aspects, features and advantages of the present invention will be more apparent from the following detailed description taken in conjunction with the accompanying drawings, in which.

DETAILED DESCRIPTION OF CERTAIN INVENTIVE EMBODIMENTS

Figure 1:
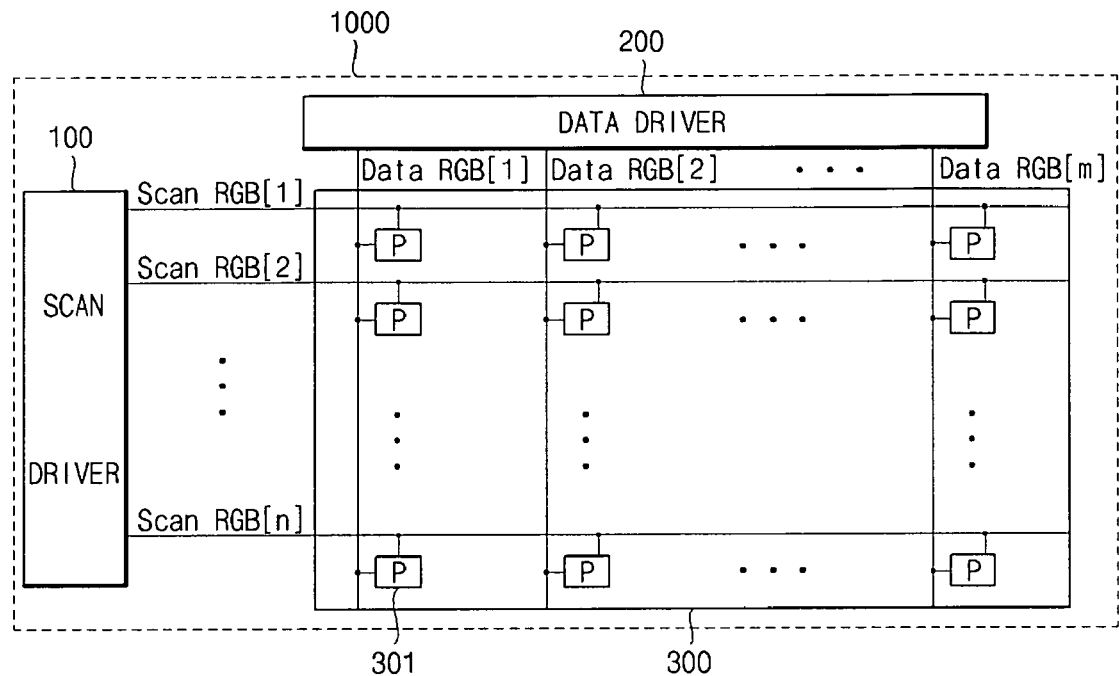
FIG. 1 is a block diagram illustrating an organic light emitting display (OLED)

Reference will now be made in detail to certain embodiments, examples of which are illustrated in the accompanying drawings, wherein like reference numerals generally refer to the like elements throughout.

FIG. 1 is a block diagram illustrating an organic light emitting display (OLED).

As illustrated in FIG. 1, an OLED 1000 includes a scan driver 100, a data driver 200, and an OLED panel (hereinafter, a panel) 300.

The scan driver 100 sequentially supplies scan signals to the panel 300 through scan lines ScanRGB[1], ScanRGB[2], . . . , ScanRGB[n].

The data driver 200 supplies data signals to the panel 300 through data lines DataRGB[1], DataRGB[2], . . . , DataRGB[m].

In addition, the panel 300 includes the plurality of scan lines ScanRGB[1], ScanRGB[1] . . . , ScanRGB[n] arranged in a row direction, the plurality of data lines DataRGB[1], DataRGB[2], . . . , DataRGB[m] arranged in a column direction, and pixels 301 near the intersections of the plurality of scan lines ScanRGB[1], ScanRGB[2], ScanRGB[n] and the data lines DataRGB[1], DataRGB[2], . . . , DataRGB[m].

Each pixel is formed in a pixel region defined by two adjacent scan lines and two adjacent data lines. As described above, the scan signals are supplied from the scan driver 110 to the scan lines ScanRGB[1], ScanRGB[2], . . . , ScanRGB[n] and the data signals are supplied from the data driver 120 to the data lines DataRGB[1], DataRGB[2], DataRGB[m].

The panel 130 receives first and second power source voltages to supply the first and second power source voltages to pixel circuits 131. The pixel circuits 131 that received the first and second power source voltages control the current that flows from the first power source voltage to the second power source voltage through light emitting devices in response to the data signals to emit light corresponding to the data signals.

Figure 2:
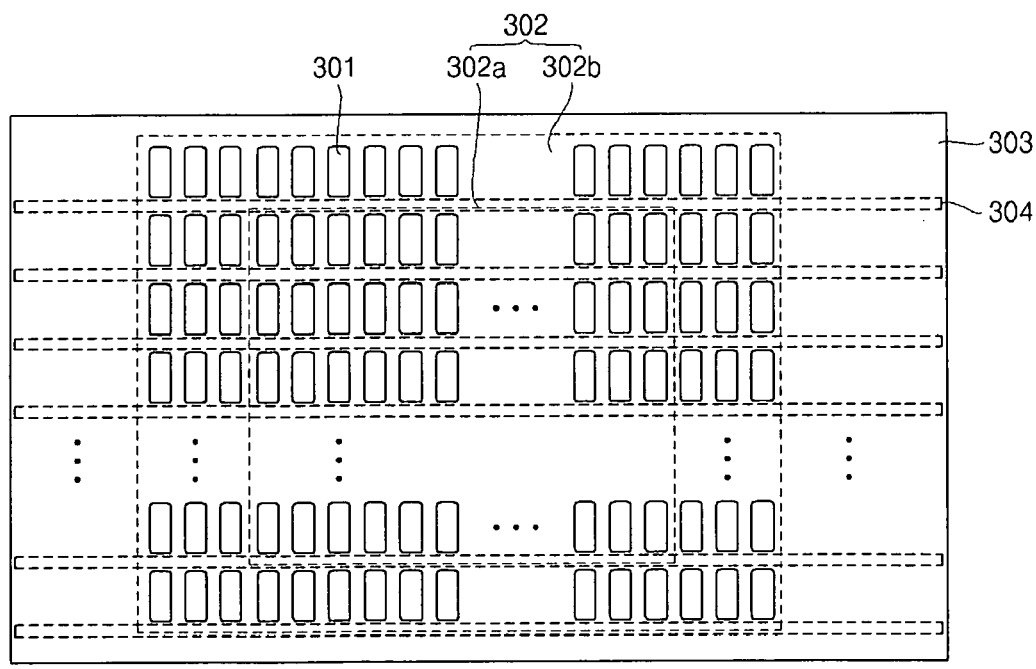
FIG. 2 is a plan view illustrating an OLED panel.

FIG. 2 is a plan view illustrating an OLED panel.

As illustrated in FIG. 2, the OLED panel includes a pixel unit 302 and a non-pixel unit 303.

The plurality of pixels 301 are formed in the pixel unit 302 in the OLED panel. The plurality of pixels 301 include OLEDs. The OLED includes an anode (which may comprise ITO), an organic thin layer, and a cathode (which may comprise metal). In some embodiments, the organic thin layer has a multi-layer structure including an emission layer (EML) that emits light by recombination of electrons and holes, an electron transport layer (ETL) that transports electrons, and a hole transport layer (HTL) that transports holes. The OLED may additionally include an electron injecting layer (EIL) that injects electrons and a hole injection layer (HIL) that injects holes. That is, the pixel unit 302 includes the EML to emit light. The pixel unit 302 is divided into a main pixel unit 302a and a dummy pixel unit 302b. In the main pixel unit 302a, when the OLED panel is in the OLED 1000 to be completed as a product, the light emission layers of the OLED emit light. That is, an image is displayed on the main pixel unit 302a so that a user can see the image. The dummy pixel unit 302b has the same structure as the structure of the main pixel unit 302a and is formed when the main pixel unit 302a is formed. However, the image is not displayed on the dummy pixel unit 302b. A spacer forming unit 304 is formed among the plurality of pixels 301 of the pixel unit 302 in the row direction. The spacer forming unit 304 includes a plurality of spacers formed in the row direction. The spacers are formed in the main pixel unit 302a and the dummy pixel unit 302b.

The non-pixel unit 303 outside the pixel unit 302 of the OLED 300, where the pixels 301 are not formed, is at least for protecting the pixel unit 302. The spacer forming unit 304 extends from the pixel unit 302 to the non-pixel unit 303 in the row direction and includes the plurality of spacers. When the spacer forming unit 304 is not formed in the non-pixel unit 303, it is not possible to protect the pixel unit 302 against an external shock.

Figure 3:
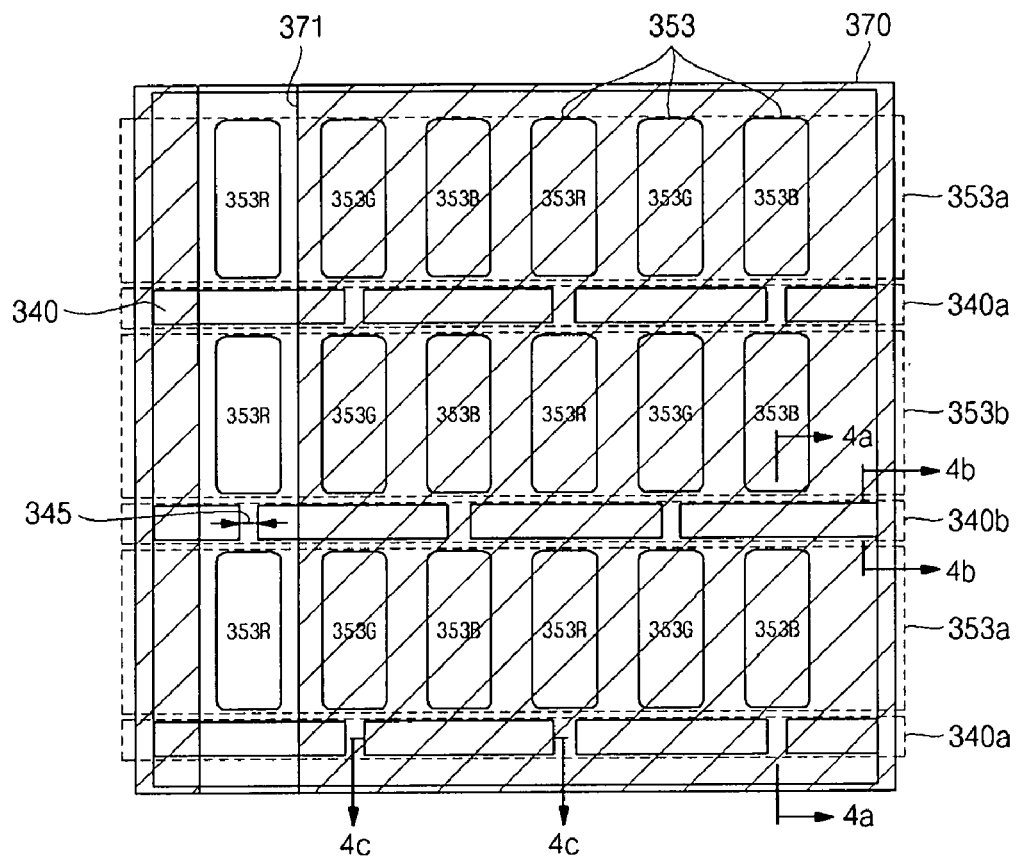
FIG. 3 is a plan view illustrating an enlarged OLED panel.

FIG. 3 is a plan view illustrating an enlarged OLED panel. In FIG. 3, a part of the OLED panel of FIG. 2 is enlarged. The pixel unit 302 of the OLED panel of FIG. 2 has the same structure as the structure of the pixel unit of the OLED panel of FIG. 3, the pixels are not formed in the non-pixel unit 302, and the spacers 340 have the same structure as the spacers of FIG. 3. In the OLED panel of FIG. 3, light emission layers 353 are formed through a fine metal mask (FMM) 370.

As illustrated in FIG. 3, the OLED panel includes rows of light emission layers 353, where adjacent rows are separated by a plurality of interleaved even and odd gaps. The OLED panel also includes spacers 340 within the even and odd gaps.

The light emission layers 353 are formed in the regions corresponding to the pixels 301 (refer to FIG. 2). The light emission layers 353 are formed as red light emission layers 353R, green light emission layers 353G, and blue light emission layers 353B by a laser induced thermal imaging (LITI) method using the FMM 370. In FIG. 3, in order to form the red light emission layers 353R, the FMM 370 having the slit 371 is positioned to expose only the column in which the red light emission layers 353R are to be formed. The red light emission layers 353R are formed in the exposed regions of the FMM 370 and the FMM 370 is moved to form the red light emission layers 353R of the next column so that the red light emission layers 353R are sequentially formed. The green light emission layers 353G and the blue light emission layers 353B are sequentially formed by the same method as the method by which the red light emission layers 353R are formed. Separation regions 345 are formed in the spacers 340 because the cathode electrode is integrally formed after the spacers 340 are formed and may be shorted because of a step difference between the spacers, resulting in a defective OLED panel. Accordingly, the separation regions 345 are beneficial. The separation regions 345 of the odd spacers 340a formed between the odd spacers 340a, and the separation regions 345 of the even spacers 340b formed between the even spacers 340b in the next row are arranged in different columns so that it is possible to prevent the FMM 370 from being caught in the separation regions 345. The light emission layers 353 include the odd light emission layers 353a and the even light emission layers 353b. The odd light emission layers 353a are the light emission layers in the odd rows of the pixel unit and are formed in the regions corresponding to the pixels 301 (refer to FIG. 2) in the odd rows. The even light emission layers 353b are the light emission layers in the even rows of the pixel unit and are formed in the regions corresponding to the pixels 301 (refer to FIG. 2) in the even rows.

The spacers 340 are formed in the region corresponding to the spacer forming region 304 (refer to FIG. 2) in the row direction and include the odd spacers 340a and the even spacers 340b. The odd spacers 340a are formed in the odd rows adjacent to the light emission layers 353a in the odd rows. The even spacers 340b are formed in the even rows adjacent to the light emission layers 353b in the even rows. The spacers 340 are separately formed in the row directions. The separation regions 345 of the odd spacers 340a and the even spacers 340b are formed in different parts. In some embodiments, the horizontal length of the spacers 340 is longer than the horizontal length of two light emission layers 353, is shorter than the horizontal length of three light emission layers, and is larger than the separation regions 345. In some embodiments, the separation regions 345 are formed in a pattern relative to the light emission layers 353. As shown in FIG. 3, the separation regions 345 are formed so as to be aligned with every other light emission layers 353 along a row, where the odd separation regions 345 are offset from the even separation regions 345 by one light emission layer 353. Other patterns may also be used. Accordingly, the separation regions 345 of the even spacers are not formed in the columns where the separation regions of the odd spacers are formed and are formed in the columns where the separation regions 345 of the odd spacers are not formed. That is, the separation regions 345 of the odd spacers are formed in different columns from the columns where the separation regions 345 of the even spacers are formed. As a result, when the FMM 370 is used and the light emission layers are formed, the slits 371 of the MFF 370 do not get caught in the separation regions 345.

Figure 4A:
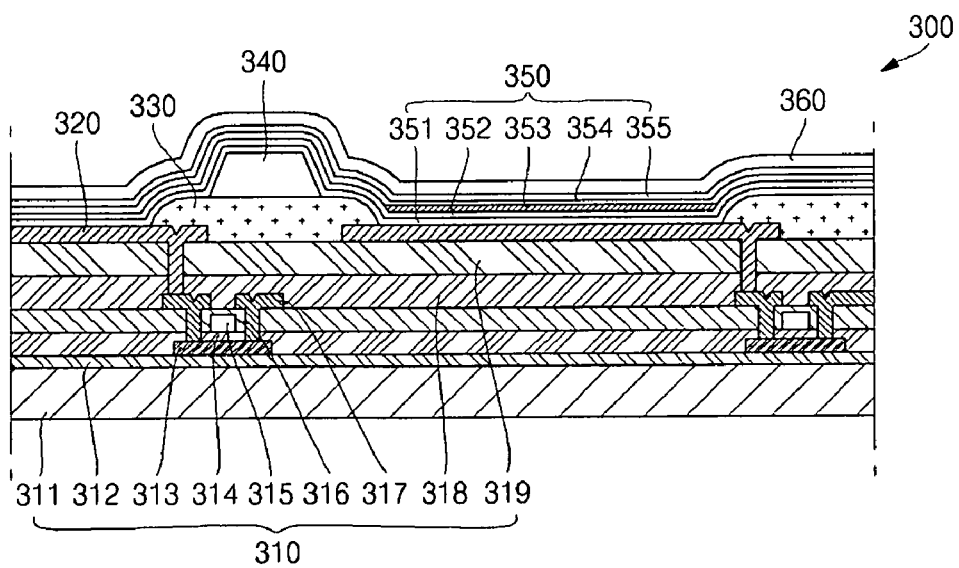
FIG. 4A is a schematic sectional view taken along the line 4A-4A of FIG. 3.
Figure 4B:
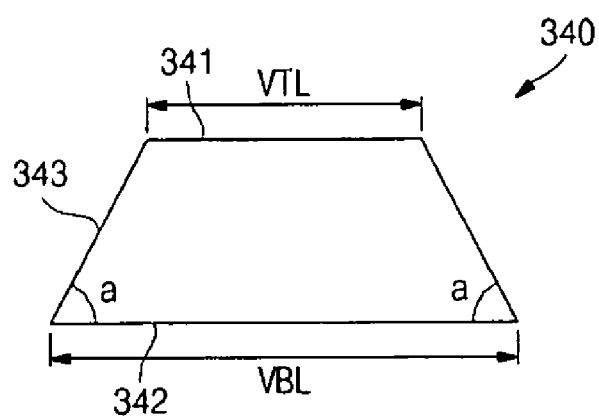
FIG. 4B is a sectional view of the spacer taken along the line 4B-4B of FIG. 3.
Figure 4C:
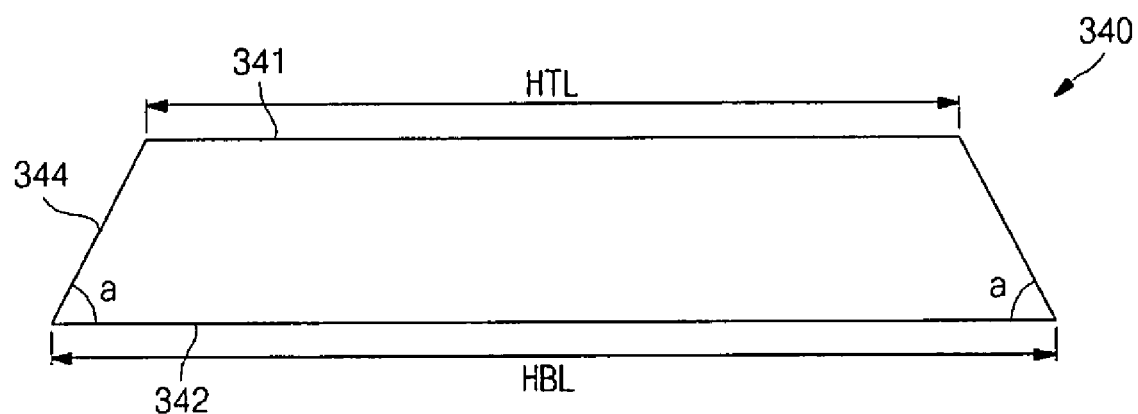
FIG. 4C is a sectional view of the spacer taken along the line 4C-4C of FIG. 3.

FIG. 4A is a schematic sectional view taken along the line 4A-4A of FIG. 3, FIG. 4B is a sectional view of the spacer taken along the line 4B-4B of FIG. 3, and FIG. 4C is a sectional view of the spacer taken along the line 4C-4C of FIG. 3.

The OLED panel 300 and the spacers 340 illustrated in FIGS. 4A, 4B, and 4C are not necessarily correctly proportionate to the actual size, thickness, and length and may be exaggerated or simplified in order to clarify. As an example, in FIG. 4A, the light emitting region and the non-light emitting region of the OLED panel 300 have similar sizes. However, in some implementations, the non-light emitting region is much smaller than the light emitting region.

The OLED panel 300 illustrated in FIG. 4A includes a lower substrate 310, anode electrodes 320 formed on the lower substrate 310, pixel define layers 330 formed on the lower substrate 310 and on the anode electrodes 320, spacers 340 formed on the pixel define layers 330 to protrude, organic thin layers 350 formed on the anode electrodes 320, the pixel define layers 330, and the spacers 340, and a cathode electrode 360 formed on the organic thin layers 350.

The lower substrate 310 includes a substrate 311, a buffer layer 312 formed on the substrate 311, active layers 313 formed on the buffer layer 312, gate insulating layers 314 formed on the active layers 313 and the buffer layer 312, gate electrodes 315 formed on the gate insulating layers 314, interlayer insulating layers 316 formed on the gate insulating layers 314 and the gate electrodes 315, source/drain electrodes 317 formed on the interlayer insulating layers 316, protecting layers 318 formed on the interlayer insulating layers 316 and the source/drain electrodes 317, and planarizing layers 319 formed on the protecting layers 318.

The substrate 310 can be formed of a glass substrate, a plastic substrate, a metal substrate, a polymer substrate, or equivalents thereof. However, the materials of the substrate of the present invention are not limited.

The buffer layer 312 is formed on the substrate 311. The buffer layer 312 prevents moisture (H2O), hydrogen (H2), and oxygen (O2) from penetrating the substrate 311 to permeate into the active layers 313 and the organic thin layer 350. Therefore, the buffer layer 312 can be formed of a silicon oxide layer (SiO2), a silicon nitride layer (Si3N4), an inorganic layer, or equivalents thereof. However, the materials of the buffer layer of the present invention are not limited. In addition, in some embodiments, the buffer layer 312 is omitted.

The active layers 313 are formed on the buffer layer 312. The active layer 313 consists of source/drain regions formed on both sides that face each other and channel regions formed between the source/drain regions. The active layers 313 can be formed of amorphous silicon (Si), poly Si, an organic thin layer, micro Si (silicon having a grain size between the amorphous Si and the poly Si), or equivalents thereof. However, the materials of the active layers 313 are not limited. In addition, when the active layers 313 are formed of the poly Si, the active layers 313 can be formed by a method of crystallizing the poly Si using a laser at a low temperature, a method of crystallizing the poly Si using a metal catalyst, or equivalents thereof. However, the method of crystallizing the poly Si is not limited.

The gate insulating layers 314 can be formed on the active layers 313. The gate insulating layers 314 can be also formed on the buffer layer 312 that is the external circumference of the active layers 313. In addition, the gate insulating layers 314 can be formed of a Si oxide layer, a Si nitride layer, an inorganic layer, or equivalents thereof. The materials of the gate insulating layers 314 of the present invention are not limited to the above.

The gate electrodes 315 can be formed on the gate insulating layers 314 corresponding to the channel regions among the active layers 313. The gate electrodes 315 have a field effect transistor (FET) structure in which an electric field is applied to the channel regions under the gate insulating layers 314 so that the channels of holes or electrons are formed in the channel regions. In addition, the gate electrodes 315 can be formed of the poly Si doped by metals (e.g. Mo, MoW, Ti, Cu, Al, AlNd, Cr, an Mo alloy, a Cu alloy, and an Al alloy) or equivalents thereof. However, the materials of the gate electrodes 315 are not limited.

The interlayer insulating layers 316 can be formed on the gate insulating layers 314 and the gate electrodes 315. The interlayer insulating layers 316 can be formed of a Si oxide layer, a Si nitride layer, polymer, plastic, glass, or equivalents thereof. However, the materials of the interlayer insulating layers 316 are not limited. Certain regions of the interlayer insulating layers 316 and the gate insulating layers 314 are etched to form contact holes that expose parts of the active layers 313.

The source/drain electrodes 317 are formed on the interlayer insulating layers 316 by, for example, a plasma enhanced chemical vapor deposition (PECVD) method, a low pressure chemical vapor deposition (LPCVD) method, a sputtering method, or equivalents thereof. The source/drain electrodes 317 may, for example, be formed in desired positions through a photoresist application process, an exposure process, a development process, an etching process, and a photo resist separation process after the above process. Conductive contacts that penetrate the interlayer insulating layers 316 are formed between the source/drain electrodes 317 and the source/drain regions of the active layers 313. The conductive contacts are formed through the previously formed contact holes.

The protecting layers 318 are formed on the source/drain electrodes 317 and the interlayer insulating layers 316 to protect the source/drain electrodes 317. The protecting layers 318 can be formed of an inorganic layer or equivalents thereof. However, the materials of the protecting layers 318 of the present invention are not limited to the above.

The planarizing layers 319 can be formed on the protecting layers 318. The planarizing layers 319 prevent the organic thin layers 350 and the cathode electrode from being shorted due to a step difference and can be formed of benzocyclo butane, acryl, or equivalents thereof. However, the materials of the planarizing layers 319 of the present invention are not limited. After the planarizing layers 319 are formed, the regions corresponding to the source/drain electrodes 317 are etched to form via holes in the protecting layers 318 and the planarizing layers 319.

Although a few embodiments have been shown and described, it would be appreciated by those skilled in the art that changes might be made without departing from the principles and spirit of the invention.

The anode electrodes 320 may be made of any of indium tin oxide (ITO), ITO/Ag, ITO/Ag/ITO, ITO/Ag/indium zinc oxide (IZO), silver alloy (ITO/Ag alloy/ITO), and equivalent thereof, but material for the anode electrode 320 is not limited. The ITO is a transparent conductive layer whose work function is uniform so that hole injecting barrier with respect to an organic light emitting thin layer is small, and the Ag is a layer to reflect light from the organic light emitting thin layer to the upper surface in a top emission type device. Conductive via holes penetrating the protecting layers 318 and the planarizing layers 319 are formed between the source/drain electrodes 317 and the anode electrodes 320. The conductive via holes serve to electrically connect the anode electrodes 320 to the source/drain regions of the active layers 313. The anode electrodes 320 may be formed in regions other than the regions 313, 314, 315, and 317, corresponding to the transistor structure, that is, the light emitting region in order to maximize the aperture ratio.

The pixel define layers 330 may be formed on the upper sides of the planarizing layers 319 and the anode electrodes 320. Moreover, the pixel define layers 330 are formed in a region corresponding to the transistor structure, that is, the non-light emitting region in order to increase the aperture ratio of pixels. The pixel define layers 330 make boundaries between the respective organic light emitting devices clearly distinguished so that light emitting boundary regions between the pixels become clear. The pixel define layers 330 may be formed of at least one selected from polyimide and the equivalent thereof, but the material for the pixel define layers 330 is not limited.

The spacers 340 are formed so as to protrude from the upper sides of the pixel define layers 330. The spacers 340 are required to prevent a panel of the OLED from being damaged by the external pressure. In other words, the spacers 340 are formed so that the panel of the OLED has a margin space formed in the upper side and the OLED is prevented from being damaged by the external pressure. The pixel define layers 330 may be formed of at least one selected from polyimide and the equivalent thereof, but the material for the pixel define layers 330 is not limited.

Next, the organic thin layers 350 may be formed on the upper sides of the anode electrodes 320, the pixel define layers 330, and the spacers 340. The organic thin layers 350 include a hole injection layer 351, a hole transport layer 352, an emitting layer 353, an electron transport layer 354, and an electron injecting layer 355. The remaining organic thin layers 351, 352, 354, and 355 may be formed over whole area of the lower substrate 310 of the OLED. The emitting layer 353 is formed in the light emitting region, corresponding to the upper side in which the anode electrodes 120 are formed, using the fine metal mask (FMM) by the laser induced thermal imaging (LITI). In the spacers 340, the separation regions 345 of even spacers are different from the separation regions 345 of odd spacers so that the slits 371 of the FMM can be prevented from being caught when the light emission layers 353 are formed using the fine metal mask (FMM).

The cathode electrode 360 may be formed on the whole area of the lower substrate 310 of the OLED in the upper side of the electron injecting layer 355. The cathode electrode may be shorted due to a step generated by the lower spacers 340 and the pixel define layers 330. Therefore, lateral sides of the pixel define layers 330 ad the spacers 340 are formed as oblique surfaces and the separation regions are formed in the spacers 340 so that the short of the cathode electrode 360 can be prevented. The lateral sides are divided into first lateral sides 343 (See FIG. 4B) in a row direction and second lateral sides 344 (See FIG. 4C) in a column direction.

The spacer in FIG. 4B includes an upper side 341, a lower side 342, and first lateral sides 343. A vertical length VTL of the upper side 341 is shorter than a vertical length VBL of the lower side 342, and the vertical length VBL of the lower side 342 is shorter than a distance where the even light emission layers and the odd light emission layers are spaced apart from each other. The lateral sides formed between the upper side 341 and the lower side 342 are the oblique sides so that the vertical length VTL of the upper side 341 prevents the cathode electrode from being short. Since the spacers 340 are formed between the light emission layers to protect the light emission layers from exterior shock, but must be formed in the non-light emitting region (See FIG. 4A), the vertical length VBL of the lower side 342 is shorter than the distance where the even light emission layers are spaced apart from the odd light emission layers. The first lateral sides 343 are oblique to prevent the cathode electrode 360 from being short, and an oblique angle a between the first lateral sides 343 and the lower side 342 may be 30 degrees to 60 degrees. If the oblique angle of the first lateral sides 343 is equal to or less than 30 degrees, the light emission layers may be introduced into other light emission layers. If the oblique angle is equal to or greater than 60 degrees, the cathode electrode formed in the upper sides of the spacers may be short due to the steps of the spacers.

The spacer in FIG. 4C includes an upper side 341, a lower side 342, and second lateral sides 344. A horizontal length of the upper side 341 is shorter than a horizontal length HBL of the lower side 342 and the horizontal length HBL of the lower side 342 is longer than a horizontal length of one light emission layer and is shorter than horizontal lengths of four light emission layers. The lateral sides formed between the upper side 341 and the lower side 342 are the oblique sides so that the horizontal length HTL of the upper side 341 prevents the cathode electrode from being short. If the horizontal length HBL of the lower side 342 is shorter than a horizontal length of one light emission layer, the slits of the fine metal mask FMM used to form the light emission layers may be caught by the spacers 340. If the horizontal length HBL of the lower side 342 is shorter than horizontal lengths of four light emission layers, the cathode electrode integrally formed in the upper sides of the spacers 340 may be short due to the steps of the spacers 340. The second lateral sides 344 are oblique to prevent the cathode electrode 360 from being short, and an oblique angle a between the second lateral sides 344 may be 30 degrees to 60 degrees and may be identical to the oblique angle of the first lateral sides. If the oblique angle of the second lateral sides 344 is equal to or less than 30 degrees, the light emission layers may be introduced into other light emission layers. If the oblique angle is equal to or greater than 60 degrees, the cathode electrode 360 formed in the upper sides of the spacers 340 may be short due to the steps of the spacers.

Figure 5:
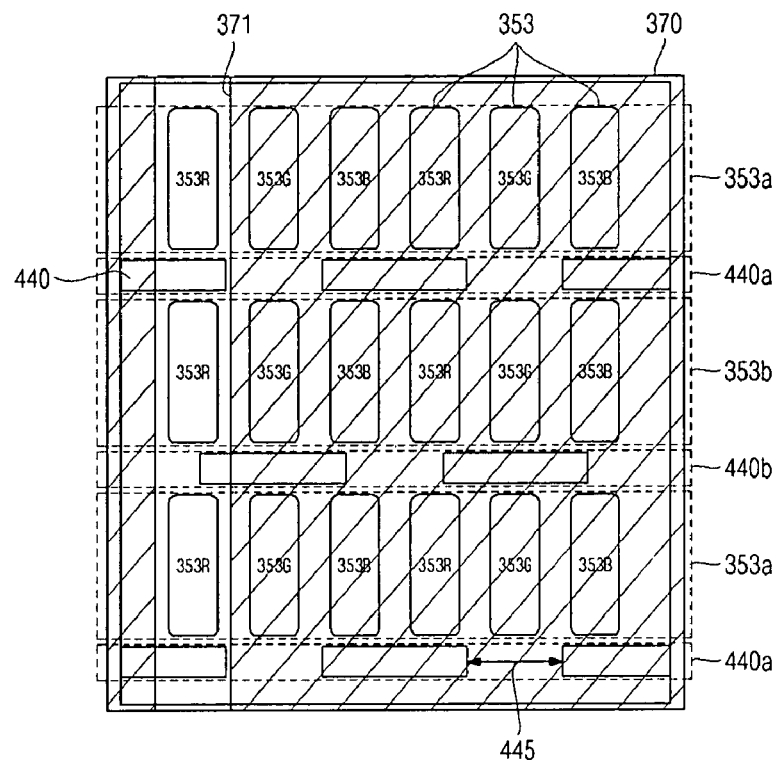
FIG. 5 is an enlarged plan view illustrating a panel of an OLED.

FIG. 5 is an enlarged plan view illustrating a panel of an OLED according to another embodiment. FIG. 5 shows a partially enlarged panel of the OLED of FIG. 2. Since the pixel unit 302 of the panel of the OLED in FIG. 2 has a structure similar to that of the OLED in FIG. 5 and the non-pixel unit 303 is not formed in the OLED in FIG. 5, the spacers 440 are similar to those of FIG. 5. The size and configuration of the spacers 440 are similar to those depicted in FIGS. 4A, 4B, and 4C. FIG. 5 illustrates the OLED when the light emission layers 353 are formed by the fine metal mask slit 371.

As illustrated in FIG. 5, the OLED panel has a structure similar to that illustrated in FIG. 3, except for the spacers 440. The spacers 440 are formed in regions corresponding to the spacer forming unit 304 of FIG. 2 in a row direction and include odd spacers 440a and even spacers 440b. The odd spacers 440a are in odd numbered rows, and the even spacers 440b are in even numbered rows. The spacers 440 are formed in the row directions and the separation regions 445 of the odd spacers 440a and the even spacers 440b are formed with differing horizontal position. The horizontal length of the spacers 440 is longer than the horizontal length of two light emission layers, is shorter than the horizontal length of three light emission layers, and is longer than the separation regions 445. The separation regions 445 are longer than the horizontal length of one light emission layer and are shorter than the horizontal length of two light emission layers. If the separation regions 445 are longer than the horizontal length of one light emission layer, the cathode electrode can be easily prevented from being short in comparison to when the separation regions 345 is shorter than the horizontal length of one light emission layer. If the separation regions 445 are longer than the horizontal length of two light emission layers, the separation regions are greater than the spacers. As a result, the slit 371 of the fine metal mask 370 may be caught by the spacers. Accordingly, the spacers are preferably formed greater than the separation regions.

When the light emission layers 353 are formed such that same colored light emission layers are formed in the row direction and the red light emission layers 353R, the green light emission layers 353G, and the blue light emission layers 353B are sequentially formed in the column direction, the separation regions 445 of the spacers are formed in the columns in a pattern analogous to the pattern of the spacers and separation regions formed in the rows, as described above. In the embodiment shown in FIG. 5, the separation regions 445 of the even spacers are not formed in the column where the separation regions of the odd spacers are formed but are formed in the column where the separation regions 445 of the odd spacers are not formed. In other words, the separation regions 445 of the odd spacers and the separation regions 445 of the even spacers are formed in different columns. Accordingly, when the light emission layers are formed by the fine metal mask 370, the slit 371 of the fine metal mask 370 can be prevented from being caught by the separation regions 445. If the separation regions 445 are not formed in the spacers 440, because the cathode electrode formed after forming the spacers 440 may be shorted due to the steps of the spacers.

Figure 6:
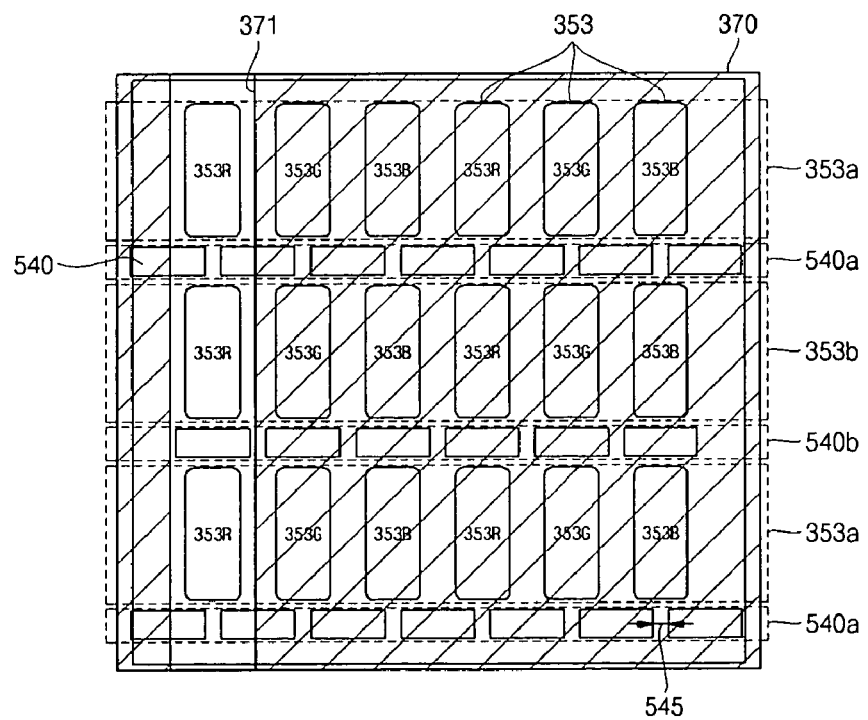
FIG. 6 is an enlarged plan view illustrating a panel of an OLED.

FIG. 6 is an enlarged plan view illustrating a panel of an OLED according to another embodiment. The enlarged plan view of the panel of the OLED in FIG. 6 shows a partially enlarged panel of the OLED of FIG. 2. Since the pixel unit 302 of the panel of the OLED in FIG. 2 has a structure similar to that of the OLED in FIG. 6 and the pixels are not formed in the non-pixel unit 303, the spacers 540 are similar to those of FIG. 6. The size and configuration of the spacers 540 are similar to those depicted in FIGS. 4A, 4B, and 4C. FIG. 6 illustrates the OLED panel when the light emission layers 353 are formed by the fine metal mask slit 370.

As illustrated in FIG. 6, the OLED panel has a structure similar to that illustrated in FIG. 3, except for the spacers 540. The spacers 540 are formed in regions corresponding to the spacer forming unit 304 (See FIG. 2) in a row direction and include odd spacers 540a and even spacers 540b. The odd spacers 540a are in odd numbered rows and the even spacers 540b are in even numbered rows. The spacers 540 are separately formed in the row directions and the separation regions 545 of the odd spacers 540a and the even spacers 540b are formed in different vertical positions. The horizontal length of the spacers 540 is longer than the horizontal length of one light emission layer, is shorter than the horizontal length of the two light emission layers, and is longer than the separation regions 545. The separation regions 545 are shorter than the horizontal length of one light emission layer.

When the light emission layers 353 are formed such that same colored light emission layers are formed in the row direction and the red light emission layers 353R, the green light emission layers 353G, and the blue light emission layers 353B are sequentially formed in the column direction, the separation regions 545 of the odd spacers are formed in the columns in a pattern analogous to the pattern of the spacers and separation regions formed in the rows, as described above. In the embodiment of FIG. 6, the separation regions 545 of the odd spacers and the separation regions 545 of the even spacers are formed in different columns. Accordingly, when the light emission layers are formed by the fine metal mask 370, the slit 371 of the fine metal mask 370 can be prevented from being caught by the separation regions 545.

Figure 7:
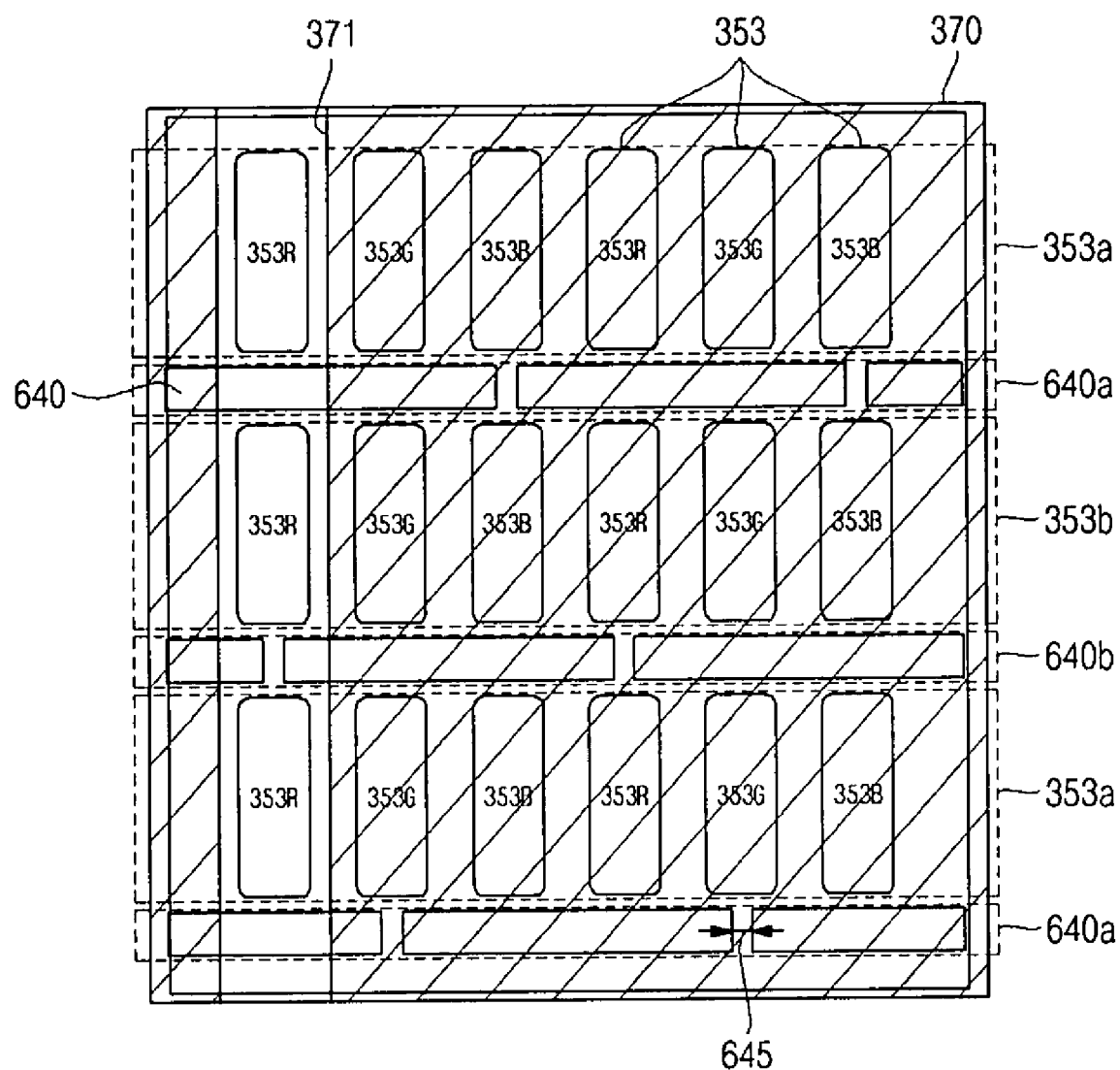
FIG. 7 is an enlarged plan view illustrating a panel of an OLED.

FIG. 7 is an enlarged plan view illustrating a panel of an OLED according to another embodiment. FIG. 7 shows a partially enlarged panel of the OLED of FIG. 2. Since the pixel unit 302 of the panel of the OLED in FIG. 2 has a structure similar to that of the OLED in FIG. 7 and the pixels are not formed in the non-pixel unit 303, only the spacers 640 are similar to those of FIG. 7. The size and configuration of the spacers 640 are similar to those depicted in FIGS. 4A, 4B, and 4C. FIG. 7 illustrates the OLED panel when the light emission layers 353 are formed by the fine metal mask slit 371.

As illustrated in FIG. 7, the OLED panel has a structure similar to that illustrated in FIG. 3, except for the spacers 640. The spacers 640 are formed in regions corresponding to the spacer forming unit 304 (See FIG. 2) in a row direction and include odd spacers 640a and even spacers 640b. The odd spacers 640a are in odd numbered rows and the even spacers 640b are in even numbered rows. The spacers 640 are separately formed in the row directions and the separation regions 645 of the odd spacers 640a and the even spacers 640b are formed in different parts. The horizontal length of the spacers 640 is longer than the horizontal length of three light emission layers, is shorter than the horizontal length of four light emission layers, and is longer than the separation regions 645. The separation regions 645 are shorter than the horizontal length of one light emission layer. If the spacers 640 are longer than the horizontal length of the four light emission layers, the cathode electrode integrally formed in the upper side of the spacers may be shorted. The separation regions 645 of the odd spacers and the separation regions 645 of the even spacers are formed in different columns. When the light emission layers are formed by the fine metal mask 370, the slit 371 of the fine metal mask 370 can be prevented from being caught by the separation regions 645.

As described above, the separation regions of the odd spacers are not aligned with the separation regions of the even spacers so that the fine metal mask can move without being caught in the spacers when the light emission layers are formed.

The foregoing detailed description has been provided for the purpose of explaining the principles of the organic light emitting display of the invention and some of its practical application. The foregoing detailed description is not intended to be exhaustive or to limit the invention to the precise embodiments disclosed. Modifications and equivalents will be apparent to practitioners skilled in this art.

What is claimed is:

1. An organic light emitting display comprising:
   a plurality of arrayed light emission layers, wherein the layers are arranged in a plurality of rows and columns, wherein adjacent rows are separated by a plurality of even and odd gaps, the even and odd gaps being interleaved;
   a pixel define layer formed in the periphery of each of the light emission layers;
   a plurality of odd spacers, each protruding from one of the pixel define layers, wherein the odd spacers are formed in odd gaps and have a plurality of odd separation regions; and
   a plurality of even spacers, each protruding from one of the pixel define layers, wherein the even spacers are formed in even gaps and have a plurality of even separation regions, wherein
   the odd separation regions are formed in different columns than the even separation regions.

2. The organic light emitting display as claimed in claim 1, wherein the odd separation regions and the even separation regions have the same width.

3. The organic light emitting display as claimed in claim 1, wherein the width of the even and odd separation regions is shorter than the length of the even and odd spacers.

4. The organic light emitting display as claimed in claim 1, wherein the column-wise length of the even and odd spacers is shorter than the column-wise length of the even and odd gaps.

5. The organic light emitting display as claimed in claim 1, wherein the column-wise length of the lower sides of the even and odd spacers is shorter than the column-wise length of the even and odd gaps.

6. The organic light emitting display as claimed in claim 1, wherein the column-wise length of lower sides of the even and odd spacers is longer than the column-wise length of upper sides of the even and odd spacers, the upper sides being farther from the pixel define layer than the lower sides.

7. The organic light emitting display as claimed in claim 1, wherein the row-wise lengths of the even and odd spacers are longer than the row-wise length of one of the light emission layers and are shorter than the row-wise length of four light emission layers.

8. The organic light emitting display as claimed in claim 7, wherein the row-wise length of the lower sides of the even and odd spacers is longer than the row-wise length of one light emission layer and are shorter than the horizontal length of the four light emission layers.

9. The organic light emitting display as claimed in claim 1, wherein the row-wise length of lower sides of the even and odd spacers is longer than a the row-wise length of upper sides of the even and odd spacers, the upper sides being farther from the pixel define layer than the lower sides.

10. The organic light emitting display as claimed in claim 1, wherein the row-wise lengths of the even and odd spacers are longer than the row-wise length of one light emission layer and are shorter than the row-wise length of two light emission layers.

11. The organic light emitting display as claimed in claim 1, wherein the row-wise lengths of the even and odd spacers are longer than the row-wise length of two light emission layers and are shorter than the row-wise length of three light emission layers.

12. The organic light emitting display as claimed in claim 1, wherein the row-wise lengths of the even and odd spacers are longer than the row-wise length of three light emission layers and are shorter than the row-wise length of four light emission layers.

13. The organic light emitting display as claimed in claim 1, wherein each of the even and odd spacers comprises:
a lower side on the pixel define layer;
an upper side opposite the lower side; and
a plurality of lateral sides obliquely connecting the lower side to the upper side.

14. The organic light emitting display as claimed in claim 13, wherein each of the even and odd spacers comprise an oblique angle between the lower side and the upper side between about 30 degrees and about 60 degrees.

15. The organic light emitting display as claimed in claim 1, wherein each of the light emission layers comprises:
a main pixel unit configured to display an image; and
a dummy pixel unit formed outside of the main pixel unit, the dummy pixel unit configured to not display the image; wherein
the odd spacers and the even spacers are formed in the main pixel unit and in the dummy pixel unit.

16. The organic light emitting display as claimed in claim 1, further comprising a non-pixel unit, in which pixels are not formed, formed outside the light emission layers, wherein
the odd spacers and the even spacers are additionally formed in the non-pixel unit.

17. The organic light emitting display as claimed in claim 1, wherein each of the light emission layers comprises:
a main pixel unit configured to display an image;
a dummy pixel unit formed outside of the main pixel unit, wherein the dummy pixel unit is configured to not display the image; and
a non-pixel unit in which the light emission layers are not formed; wherein
the even and odd spacers are formed in the main pixel unit, in the dummy pixel unit, and in the non-pixel unit, wherein the even and odd spacers are configured to protect the light emitting regions.

18. The organic light emitting display as claimed in claim 1, further comprising:
a plurality of anode electrodes formed below the light emission layers;
a cathode electrode formed above the light emission layers, the pixel define layer, the odd spacers, and the even spacers; and
a pixel circuit formed in a region of the lower side of the pixel define layer corresponding to the pixel define layer.

19. The organic light emitting display as claimed in claim 18, further comprising:
a hole injection layer formed between the anode electrode and the light emission layers and in above the pixel define layer, the odd spacers, and the even spacers; and
a hole transport layer formed above the hole injection layer.

20. The organic light emitting display as claimed in claim 19, further comprising:
an electron transport layer formed above the light emission layers in regions corresponding to the light emission layers and formed above the hole transport layer in regions other than the regions corresponding to the light emission layer; and
an electron injecting layer formed between the electron transport layer and the cathode electrode.

* * * * *